United States Patent [19]
Muto

[11] Patent Number: 5,866,484
[45] Date of Patent: Feb. 2, 1999

[54] SEMICONDUCTOR DEVICE AND PROCESS OF PRODUCING SAME

[75] Inventor: Yoshio Muto, Tokyo, Japan

[73] Assignee: Nippon Steel Corporation, Tokyo, Japan

[21] Appl. No.: 888,125

[22] Filed: Jul. 3, 1997

[30] Foreign Application Priority Data

Jul. 9, 1996 [JP] Japan .................................. 8-198446
Oct. 15, 1996 [JP] Japan .................................. 8-293368

[51] Int. Cl.⁶ ................................................ H01L 21/00
[52] U.S. Cl. ..................... 438/738; 438/742; 438/652; 257/750
[58] Field of Search ..................... 438/714, 734, 438/735, 737, 738, 740, 742, 743, 637, 644, 652, 672; 257/750, 751, 753, 763, 764, 765

[56] References Cited

U.S. PATENT DOCUMENTS 4,184,909 1/1980 Chang et al. .................. 216/18 X
5,686,354 11/1997 Avanzino et al. ................ 216/18

FOREIGN PATENT DOCUMENTS

A-3-44930 2/1991 Japan .
A-5-36839 2/1993 Japan .

*Primary Examiner*—William Powell
*Attorney, Agent, or Firm*—Pollock, Vande Sande & Amernick

[57] ABSTRACT

The object of the present invention is to provide a semiconductor device and a process of producing the same, in which a low contact resistance is ensured, the interwiring connection of a multilayered conductor wiring structure has good long term reliability, and the production time can be reduced. An interlaminar insulating layer 4 is etched with an etchant gas containing a fluorine-based gas to form a contact hole 6, during which a fluoride layer 22 is formed on a Ti layer 13 which forms an upper protective layer of a conductor wiring layer 3 on the bottom of the contact hole 6. According to the present invention, the fluoride layer 22 is removed, together with the Ti layer 13 on the bottom of the contact hole 6, by a gas mixture of a fluorine-based gas and oxygen gas in an ashing apparatus.

17 Claims, 4 Drawing Sheets

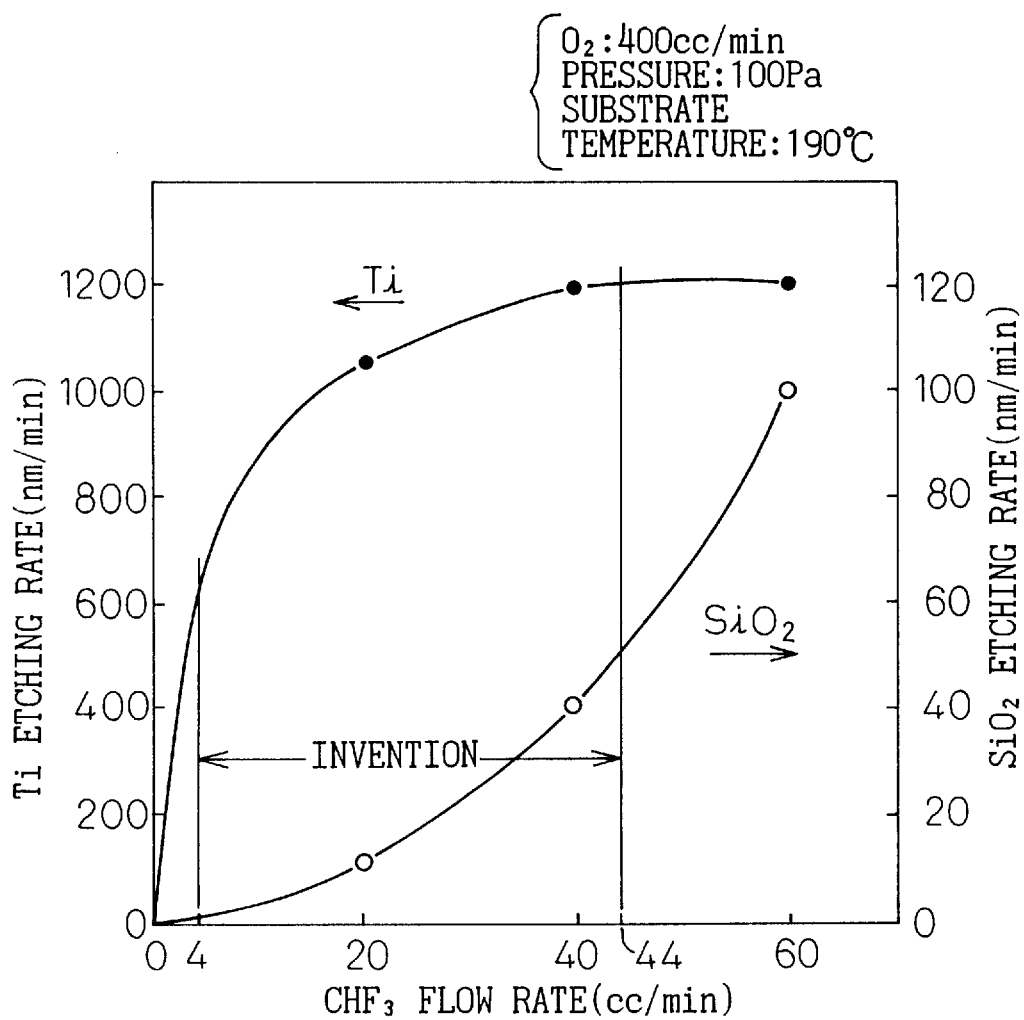

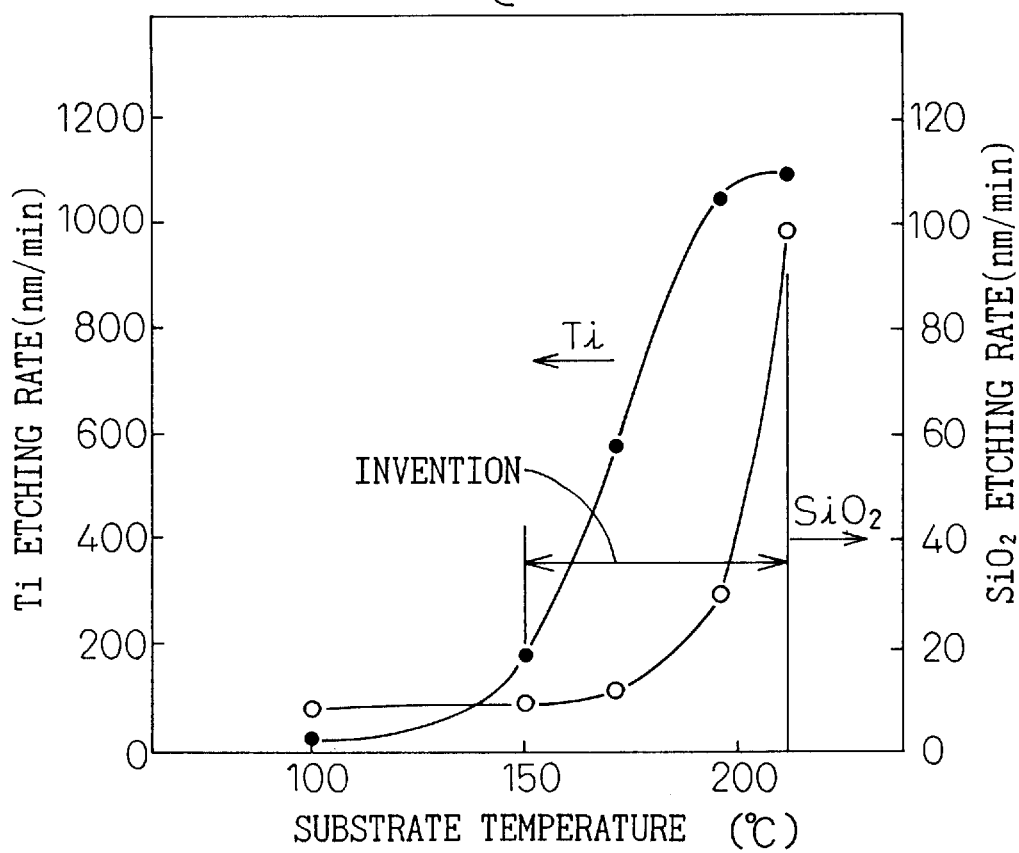

SEMICONDUCTOR DEVICE AND PROCESS OF PRODUCING SAME

BACKGROUND OF THE INVENTION

1. Field of the Invention

The present invention relates to a semiconductor device and a process of producing the same, particularly a semiconductor device having a multilayered conductor wiring structure including an upper conductor wiring layer is electrically connected to a lower conductor wiring layer through a contact hole and a process of producing the same.

2. Description of the Related Art

The recent progress in the integration of semiconductor devices has included further refinement of semiconductor elements and the development of multilayered conductor wiring structures.

In the development of multilayered conductor wiring structures, to provide an improved resistance to electromigration and stress migration, which would otherwise cause an increase in the wiring resistance and number of disconnections, it is known that a barrier metal layer and a cap metal layer of a Ti-based film such as Ti, TiN, TiW can be formed on the upper and lower surfaces of a conductor wiring layer composed of an aluminum alloy.

A conductor wiring layer having the above-mentioned triple-layer structure is used to form a multilayered conductor wiring structure such as a two-layer structure, in which a contact hole is formed through an interlaminar insulating layer to electrically connect upper and lower conductor wiring layers through the interlaminar insulating layer.

The contact hole occasionally contains an undesirable denaturated layer of oxides or nitrides formed on the bottom surface thereof defined by the upper surface of the cap metal layer of the underlying lower conductor wiring layer.

To remove the denaturated layer, there are proposed a method in which a gas mixture of a fluorine-based gas and an inert gas is used to etch the denaturated layer (Japanese Unexamined Patent Publication (Kokai) No. 3-44930) and a method in which the same gas mixture is used to open a contact hole by reactive ion etching (RIE).

When a contact hole is formed by reactive ion etching using the gas mixture of a fluorine-based gas and an inert gas as mentioned above, the cap metal layer of the lower conductor wiring layer and the fluorine-based gas of the gas mixture react with each other to form a fluorine compound layer on the upper surface of the cap metal layer in the portion exposed in the contact hole, the portion defining the bottom surface of the contact hole.

The fluorine compound layer is conventionally removed by sputter-etching using an inert gas.

To ensure complete removal of the fluorine compound layer, the sputter-etching must be continued for a long time, during which not only the fluorine compound layer is sputtered but also the interlaminar insulating layer having a large area is sputtered or bombarded by the inert gas ions to generate splash particles, which redeposit on the exposed portion of the cap metal layer within the contact hole.

When an upper conductor wiring layer is formed by filling a conductor material in the contact hole, a deposit layer of the splash particles remains at the interface between the upper and lower conductor wiring layers to cause a detrimental problem that the contact resistance arises and the long term reliability of the interwiring connection is lost.

To solve this problem, Japanese Unexamined Patent Publication (Kokai) No. 5-36839, for example, proposed a method in which a photoresist used for forming a contact hole is left unremoved and a fluorine compound layer on the contact hole bottom is removed by sputter-etching using the photoresist as a mask.

This method prevents deposition of splash particles on the contact hole bottom when a thick fluorine compound layer on the contact hole bottom is sputter-etched, because an interlaminar insulating layer is covered with the photoresist and is not subject to the sputter-etching.

However, the method of Japanese Unexamined Patent Publication (Kokai) No. 5-36839 has a drawback in that sputter-etching must be continued for a long time to remove a thick fluorine compound layer on the contact hole bottom, which prevents a time reduction in the production of semiconductor devices.

SUMMARY OF THE INVENTION

The object of the present invention is to provide a semiconductor device and a process of producing the same, in which a low contact resistance is ensured, the interwiring connection of a multilayered conductor wiring structure has good long term reliability, and the production time can be reduced.

To achieve the above object according to the first aspect of the present invention, there is provided a semiconductor device, comprising:

a semiconductor substrate;

a first insulating layer formed over the semiconductor substrate;

a first conductor wiring layer formed on the first insulating layer and having a three-layer structure composed by sequential deposition of a first conductive lower protective layer, a first metal layer, and a first conductive upper protective layer in that order;

a second insulating layer covering the first conductor wiring layer;

a contact hole extending through the second insulating layer and the first conductive upper protective layer of the first conductor wiring layer to expose an upper surface portion of the first metal layer; and a second conductor wiring layer formed and patterned on the inner surface of the contact hole and on the second insulating layer and having a three-layer structure composed by sequential deposition of a second conductive lower protective layer, a second metal layer, and a second conductive upper protective layer in that order, the second conductor wiring layer being electrically connected to the first conductor wiring layer through the second conductive lower protective layer electrically connected to the entire area of the upper surface portion of the first metal layer defining the bottom surface of the contact hole.

According to the second aspect of the present invention, there is provided a semiconductor device, comprising:

a semiconductor substrate;

a first insulating layer formed over the semiconductor substrate;

a first conductor wiring layer formed on the first insulating layer and having a three-layer structure composed by sequential deposition of a first conductive lower protective layer, a first metal layer, and a first conductive upper protective layer in that order;

a second insulating layer covering the first conductor wiring layer;

a contact hole extending through the second insulating layer and the first conductive upper protective layer of the first conductor wiring layer to expose an upper surface portion of the first metal layer; and a second conductor wiring layer composed of a second conductive lower protective layer covering an inner surface of the contact hole and defining an inner space of the contact hole, a contact plug filling the inner space of the contact hole, a second conductive upper protective layer formed and patterned on the second insulating layer including the portion above the contact hole, and a second metal layer formed and patterned on the second conductive upper protective layer to have substantially the same shape as the second conductive upper protective layer, the second conductor wiring layer being electrically connected to the first conductor wiring layer through the second conductive lower protective layer electrically connected to the entire area of the upper surface portion of the first metal layer defining the bottom surface of the contact hole.

In an embodiment of the semiconductor device according to the present invention, the first conductive lower protective layer, the first conductive upper protective layer, the second conductive lower protective layer, and the second conductive upper protective layer comprise one material selected from TiN, Ti, and a two-layer material composed of a lower Ti layer and an upper TiN layer and the first metal layer and the second metal layer comprise an aluminum alloy.

According to the third aspect of the present invention, there is provided a process of producing a semiconductor device, comprising:

a first step of forming a first insulating layer over a semiconductor substrate and then sequentially depositing on the first insulating layer a first conductive lower protective layer, a first metal layer, and a first conductive upper protective layer in that order;

a second step of patterning the first conductive lower protective layer, the first metal layer, and the first conductive upper protective layer to form a first conductor wiring layer having a three-layer structure;

a third step of forming a second insulating layer covering the first conductor wiring layer;

a fourth step of etching the second insulating layer by using a first etchant gas containing a fluorine-based gas to form a contact hole, thereby exposing a surface portion of the first conductive upper protective layer of the first conductor wiring layer;

a fifth step of, after the fourth step, etching the entire area of the first conductive upper protective layer in a portion exposed in the contact hole by using a second etchant gas containing a fluorine-based gas and oxygen gas to expose an upper surface portion of the first metal layer;

a sixth step of sequentially forming on an inner surface of the contact hole and on the second insulating layer a second conductive lower protective layer, a second metal layer, and a second conductive upper protective layer in that order to electrically connect the second conductive lower protective layer to the entire area of the upper surface portion of the first metal layer defining a bottom surface of the contact hole;

a seventh step of patterning the second conductive lower protective layer, the second metal layer, and the second conductive upper protective layer to form a second conductor wiring layer electrically connected to the first conductor wiring layer and having a three-layer structure.

According to the fourth aspect of the present invention, there is provided a process of producing a semiconductor device, comprising:

a first step of forming a first insulating layer over a semiconductor substrate and then sequentially depositing on the first insulating layer a first conductive lower protective layer, a first metal layer, and a first conductive upper protective layer in that order;

a second step of patterning the first conductive lower protective layer, the first metal layer, and the first conductive upper protective layer to form a first conductor wiring layer having a three-layer structure;

a third step of forming a second insulating layer covering the first conductor wiring layer;

a fourth step of etching the second insulating layer by using a first etchant gas containing a fluorine-based gas to form a contact hole, thereby exposing a surface portion of the first conductive upper protective layer of the first conductor wiring layer;

a fifth step of, after the fourth step, etching the entire area of the first conductive upper protective layer in a portion exposed in the contact hole by using a second etchant gas containing a fluorine-based gas and oxygen gas to expose an upper surface portion of the first metal layer;

a sixth step of forming a second conductive lower protective layer covering an inner surface of the contact hole to electrically connect the second conductive lower protective layer to the entire area of the upper surface portion of the first metal layer defining a bottom surface of the contact hole;

a seventh step of forming a conductive contact plug filling an inner space of the contact hole defined by the second conductive lower protective layer;

an eighth step of sequentially forming a second conductive upper protective layer and a second metal layer on the second insulating layer including a portion above the contact hole in that order to electrically connect the second conductive upper protective layer to the second conductive lower protective layer and the contact plug, which are within the contact hole;

a ninth step of patterning the second conductive upper protective layer and the second metal layer to form a second conductor wiring layer electrically connected to the first conductor wiring layer and composed of the second conductive lower layer, the contact plug, the second conductive upper protective layer and the second metal layer.

In an embodiment of the process according to the present invention, in the fifth step, the fluorine-based gas contained in the second etchant gas is at least one selected from the group consisting of $CHF_3$, $CF_4$, $CH_2F_2$, $C_2F_6$, $C_4F_8$, and $SF_6$.

In an embodiment of the process according to the present invention, in the fifth step, the fluorine-based gas is present in a mixing ratio of from 1% to 10% based on the total flow of the second etchant gas.

In an embodiment of the process according to the present invention, in the fifth step, the semiconductor substrate is held at a temperature of from 150° C. to 220° C.

An embodiment of the process according to the present invention further comprises a step of cleaning the inside of the contact hole with a cleaning liquid after the fifth step and before the sixth step.

BRIEF DESCRIPTION OF THE DRAWINGS

FIG. 3 is a graph showing the relationship between the $CHF_3$ gas flow and the deposition rate for Ti and $SiO_2$; and FIG. 4 is a graph showing the relationship between the substrate temperature and the deposition rate for Ti and $SiO_2$.

DESCRIPTION OF THE PREFERRED EMBODIMENTS

Referring to the attached drawings, a semiconductor device and a process of producing the same according to the present invention will be described below.

First Embodiment

The first embodiment of the present invention will first be described. This embodiment is advantageously applied to the production of a semiconductor device such as a MOS transistor having a gate electrode and source/drain regions and the following description will be focused on a multi-layered conductor wiring structure and its vicinity, on a semiconductor device having this structure and on a process of producing the same.

FIGS. 1(a) to 1(f) are cross-sectional views sequentially showing steps of a process of producing a semiconductor device according to the first embodiment of the present invention.

Figure 1A:
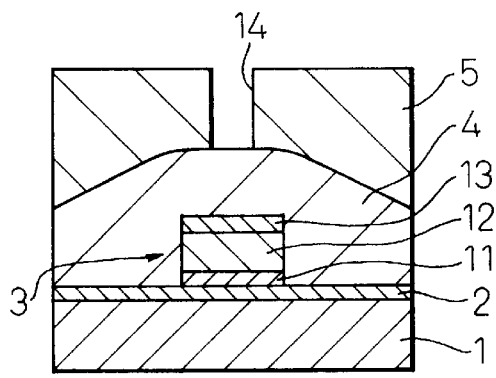
FIGS. 1(a) to 1(f) are schematic cross-sectional views sequentially showing steps of a process of producing a semiconductor device according to the first embodiment of the present invention.

As shown in FIG. 1(a), an insulating layer 2 of $SiO_2$ is first deposited on a silicon semiconductor substrate 1. On the $SiO_2$ insulating layer 2, a conductive lower protective layer 11 of TiN, a metal layer 12 of an aluminum alloy, and a conductive upper protective layer 13 of Ti are sequentially deposited in that order, which are then patterned by photolithography followed by dry etching to form a lower conductor wiring layer 3.

An interlaminar insulating layer 4 of $SiO_2$ is formed to cover the lower conductor wiring layer 3. A photoresist is applied on the interlaminar insulating layer 4 and a contact hole pattern 14 is then formed in the photoresist by photolithography to provide a mask 5.

Figure 1D:
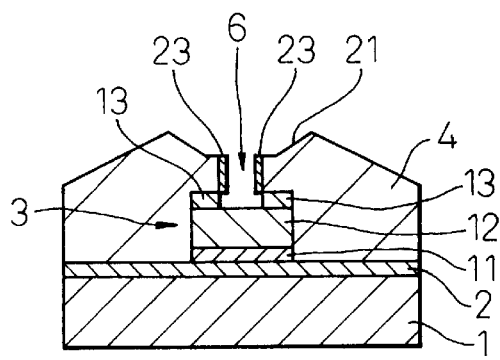
Figure 1B:
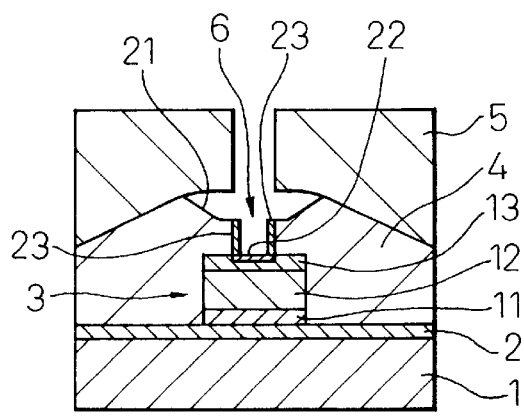

As shown in FIG. 1(b), to reduce the aspect ratio of a contact hole to be formed later, the interlaminar insulating layer 4 on the lower conductor wiring layer 3 is isotropically etched with a buffered fluoric acid to form a groove 21 under the pattern 14 of the mask 5. The groove 21 has an inner wall having a gentle slope and extending wider than the pattern 14.

The bottom of the groove 21 in the interlaminar insulating layer 4 is then pierced or anisotropically etched by reactive ion etching (RIE) using a gas mixture of a fluorine-based gas and an inert gas as a first etchant gas to open a contact hole 6 having a shape corresponding to that of the pattern 14 of the mask 5, thereby exposing an upper surface portion of the upper protective layer 13. The first etchant gas was composed of $CF_4$ gas and $CHF_3$ gas as a fluorine-based gas and Ar gas as an inert gas.

The reactive ion etching also causes a fluorine compound layer 22 to be formed on the bottom of the contact hole 6 that is defined by the upper protective layer 13, and at the same time, a titanium fluoride layer 23 is formed from titanium sputtered out of the upper protective layer 13 by the ion bombardment and is stuck to the side wall of the contact hole 6.

The fluorine compound layer 22 and the titanium fluoride layer 23 must be removed as will be herein described later.

Figure 1E:
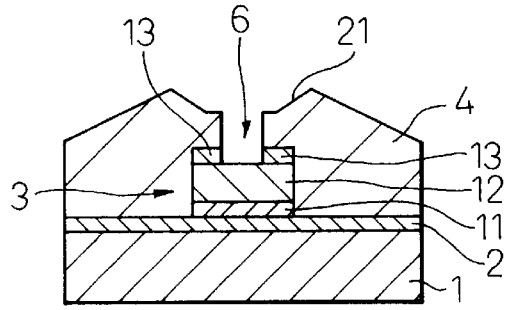
Figure 1C:
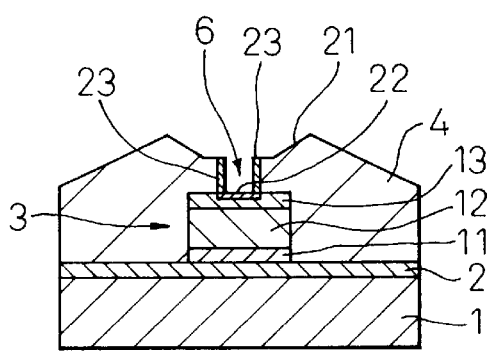

As shown in FIG. 1(c), in a usual microwave downstream type ashing apparatus (hereinafter referred to as "an ashing apparatus", not shown), the photoresist mask 5 is removed by ashing using $O_2$ gas. The ashing was performed under the conditions of: an $O_2$ gas flow of 400 cc/min, a pressure of 130 Pa, a microwave power of 800 W, and a temperature of the silicon semiconductor substrate 1 of 180° C.

The fluorine compound layer 22 and the titanium fluoride layer 23 are then removed by the following steps 1 and 2.

In step 1, referring to FIG. 1(d), in the same ashing apparatus as used above, the fluorine compound layer 22, together with the upper protective layer 13 in the portion defining the bottom of the contact hole 6, is removed by chemical etching using a gas mixture of a fluorine-based gas and $O_2$ gas as a second etchant gas. Although the fluorine-based gas of the second etchant gas was $CHF_3$ in this example, it is not limited thereto but other fluorine-based gases such as $CF_4$, $CH_2F_2$, $C_2F_6$, $C_4F_8$, and $SF_6$ may also be advantageously used.

The etching was performed under the conditions: $O_2$ and $CHF_3$ gas flows of 400 and 200 cc/min, a pressure of 100 Pa, a microwave power of 800 W, and a temperature of the silicon semiconductor substrate 1 of 180° C. As will be herein described later in the Experimental portion, the fluorine-based gas is preferably present in a mixing ratio of from 1% to 10% based on the total flow of the second etchant gas and the semiconductor substrate 1 is held at a temperature of from 150° C. to 220° C. In the first embodiment, the mixing ratio is calculated by 20/420=4.8%.

In step 2, referring to FIG. 1(e), a selected exfoliating and cleaning solution (for example, "106 exfoliating solution" (trade name) available from Tokyo Ohka Kogyo Co., Ltd.) is used to clean and remove the titanium fluoride layer 23 stuck to the side wall of the contact hole 6.

The processing through steps 1 and 2 thus removes the fluorine compound layer 22 (together with the upper protective layer 13 in the portion defining the bottom of the contact hole 6) and the titanium fluoride layer 23.

If the fluorine compound layer 22 remains partially unremoved by step 1, it is completely removed by step 2.

Step 1 and the ashing of photoresist 5 may be performed in a reversed order so that the fluorine compound layer 22 and the upper protective layer 13 in the contact hole 6 are removed together, and the photoresist mask 5 is then removed.

Thereafter, a usual sputtering apparatus is used to sputter-etch or remove a natural oxide layer formed on the upper surface portion of the metal layer 12 that has been exposed upon removal of the upper protective layer 13 in the portion defining the bottom of the contact hole 6.

Figure 1F:
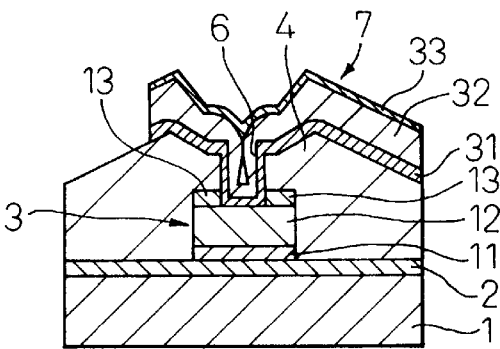

As shown in FIG. 1(f), an upper conductor wiring layer 7 is then formed in the contact hole 6 and on the interlaminar insulating layer 4.

On the interlaminar insulating layer 4 and in the contact hole 6, a conductive lower protective layer 31 of TiN, a metal layer 32 of an aluminum alloy, and a conductive upper protective layer 33 are sequentially deposited in that order. The thus-formed lower protective layer 31 covers the inner surface of the contact hole 6 and is electrically connected to the metal layer 12 over the entire area thereof defining the bottom of the contact hole 6. The inner space of the contact hole 6 that is defined by the lower protective layer 31 in the contact hole 6 is filled with a portion of the metal layer 32.

Finally, photolithography and the subsequent dry etching are performed to pattern the lower protective layer 31, the metal layer and the upper protective layer 33 to form the upper conductor wiring layer 33 having a wiring pattern as designed. The thus-formed upper conductor wiring layer 7 is electrically connected to the lower conductor wiring layer 3 through the contact hole 6 to complete a multilayered conductor wiring structure, or a two-layer structure composed of the lower and upper conductor wiring layers 3 and 7 in this case.

As described above, in the first embodiment, sputter-etching using a sputtering apparatus is only performed when removing a natural oxide layer formed on the upper surface of the metal layer 12 exposed at the bottom of the contact hole 6, and the fluorine compound layer 22 is removed without using sputter-etching.

In the conventional process in which the fluorine compound layer 22 is removed by sputter-etching for a long time, the interlaminar layer 4 is sputtered out to redeposit a layer of the material thereof ($SiO_2$, in this case) on the upper surface portion of the upper protective layer 11 of the lower conductor wiring layer 3 exposed at the bottom of the contact hole 6.

In contrast, according to the first embodiment of the present invention, removal of the fluorine compound layer 22 does not involve a long time sputter-etching, so that the production time is significantly reduced and the redeposition of the material of the interlaminar insulating layer 4 does not occur.

The first embodiment is also advantageous because, although the upper protective layer 13 of the lower conductor wiring layer 3 removed in the portion exposed in the contact hole 6, the lower protective layer 31 of the upper conductor wiring layer 7 is present in the contact hole 6 to ensure the resistance to electromigration of the lower conductor wiring layer 3. It is also advantageous that the contact resistance is further reduced without reduction in the resistance to electromigration, by removing the upper protective layer 13 of the lower conductor wiring layer 3 in the portion corresponding to the contact hole 6 and by filling the contact hole 6 (i.e., the inner space of the contact hole 6 that is defined by the lower protective layer 31 of the upper conductor wiring layer 7) with an aluminum alloy having a resistivity lower than that of titanium of the upper protective layer 13.

Second Embodiment

The second embodiment of the present invention will then be described. This embodiment also relates to a semiconductor device and a process of production thereof in the same manner as in the first embodiment, except that a contact plug is formed in a contact hole.

FIGS. 2(a) to 2(g) are schematic cross-sectional views sequentially showing steps of a process of producing a semiconductor device according to the second embodiment of the present invention, in which the corresponding components are denoted by the same reference numerals as in the first embodiment and duplicate description thereof is omitted.

Figure 2A:
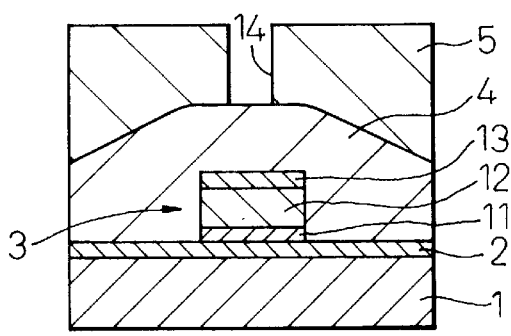
FIGS. 2(a) to 2(g) are schematic cross-sectional views sequentially showing steps of a process of producing a semiconductor device according to the second embodiment of the present invention.

Referring to FIG. 2(a), in the same manner as in the first embodiment, a lower conductor wiring layer 3 having a three-layer structure composed of a conductive lower protective layer 11, a metal layer 12, and a conductive upper protective layer 13 is formed and patterned on a silicon semiconductor substrate 1, an interlaminar insulating layer 4 is formed to cover the lower conductor wiring layer 3, and a photoresist is applied on the interlaminar insulating layer 4 and a contact hole pattern 14 is formed in the photoresist to provide a mask 5.

Figure 2B:
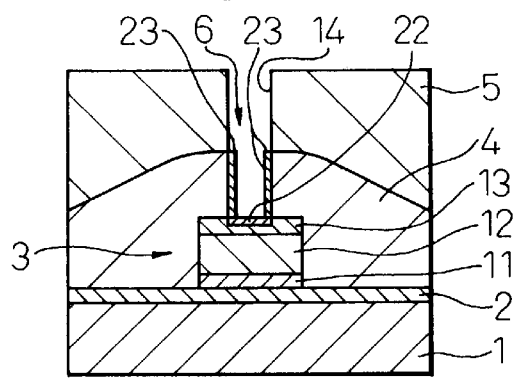

As shown in FIG. 2(b), the interlaminar insulating layer 4 is then pierced or anisotropically etched by reactive ion etching (RIE) using a gas mixture of a fluorine-based gas and an inert gas as a first etchant gas to open a contact hole 6 having a shape corresponding to that of the pattern 14 of the mask 5, thereby exposing an upper surface portion of the upper protective layer 13. The first etchant gas was composed of $CF_4$ gas and $CHF_3$ gas as a fluorine-based gas and Ar gas as an inert gas.

Figure 2C:
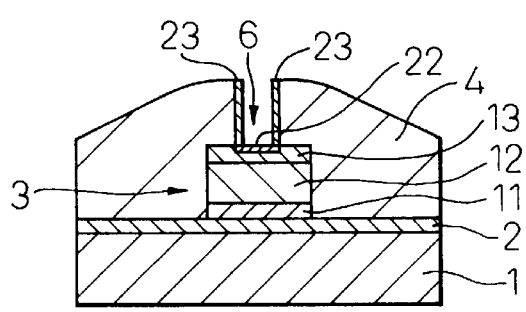

As shown in FIG. 2(c), in a usual microwave downstream type ashing apparatus (not shown), the photoresist mask 5 is removed by ashing using $O_2$ gas. The ashing was performed under the conditions of: an $O_2$ gas flow of 400 cc/min, a pressure of 130 Pa, a microwave power of 800 W, and a temperature of the silicon semiconductor substrate 1 of 180° C.

The fluorine compound layer 22 and the titanium fluoride layer 23 are then removed by the following steps 1 and 2.

Figure 2D:
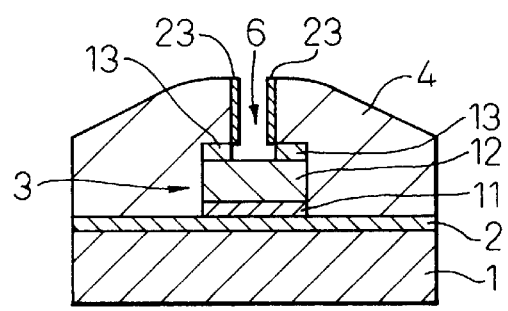

In step 1, referring to FIG. 2(d), in the same ashing apparatus as used above, the fluorine compound layer 22, together with the upper protective layer 13 in the portion defining the bottom of the contact hole 6, is removed by chemical etching using a gas mixture of a fluorine-based gas and $O_2$ gas as a second etchant gas. Although the fluorine-based gas of the second etchant gas was $CHF_3$ in this example, it is not limited thereto but other fluorine-based gases such as $CF_4$, $CH_2F_2$, $C_2F_6$, $C_4F_8$, and $SF_6$ may also be advantageously used.

The etching was performed under the conditions: $O_2$ and $CHF_3$ gas flows of 400 and 200 cc/min, a pressure of 100 Pa, a microwave power of 800 W, and a temperature of the silicon semiconductor substrate 1 of 180° C. As will be herein described later in the Experimental portion, the fluorine-based gas is preferably present in a mixing ratio of from 1% to 10% based on the total flow of the second etchant gas and the semiconductor substrate 1 is held at a temperature of from 150° C. to 220° C. In the second embodiment, the mixing ratio is calculated by 20/420=4.8%.

Figure 2E:
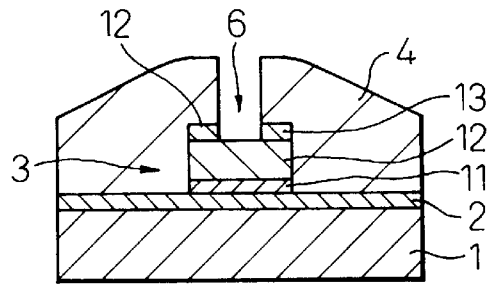

In step 2, referring to FIG. 2(e), a selected exfoliating and cleaning solution (for example, "106 exfoliating solution" (trade name) available from Tokyo Ohka Kogyo Co., Ltd.) is used to clean and remove the titanium fluoride layer 23 stuck to the side wall of the contact hole 6.

The processing through steps 1 and 2 thus removes the fluorine compound layer 22 (together with the upper protective layer 13 in the portion defining the bottom of the contact hole 6) and the titanium fluoride layer 23.

If the fluorine compound layer 22 partially remains unremoved by step 1, it is completely removed by step 2.

Step 1 and the ashing of photoresist 5 may be performed in a reversed order so that the fluorine compound layer 22 and the upper protective layer 13 in the contact hole 6 are removed together, and the photoresist mask 5 is then removed.

Thereafter, a usual sputtering apparatus is used to sputter-etch or remove a natural oxide layer formed on the upper surface portion of the metal layer 12 that has been exposed upon removal of the upper protective layer 13 in the portion defining the bottom of the contact hole 6.

Figure 2F:
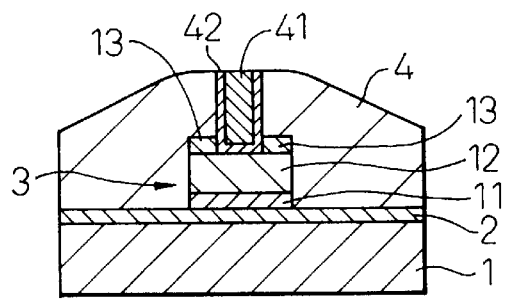
Figure 2G:
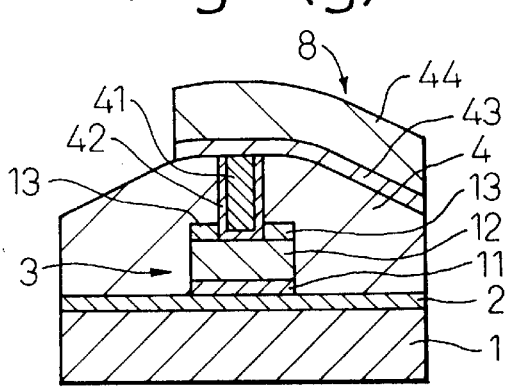

Referring to FIGS. 2(f) and 2(g), an upper conductor wiring layer 8 having a contact plug 41 filling the contact hole 6 is then formed on the interlaminar insulating layer 4.

As shown in FIG. 2(f), a conductive lower protective layer 42 of TiN is formed over the entire surface including the inside of the contact hole 6, and tungsten (W) is then deposited by CVD on the lower protective layer 42 in the contact hole 6 to fill the inner space of the contact hole 6 defined by the lower protective layer 42. The entire surface is then etched back to expose the surface of the interlaminar insulating layer 4 and to form a contact plug 41. The lower protective layer 42 covers the inner surface of the contact hole 6 and the contact plug 41 fills the inner space of the contact hole 6 that is defined by the lower protective layer 42 on the inner surface of the contact hole 6.

As shown in FIG. 2(g), on the interlaminar insulating layer 4 including the portion above the contact hole 6, a conductive upper protective layer 43 of Ti and a metal layer 44 of an aluminum alloy are sequentially deposited in that order, and photolithography and the subsequent dry etching are then performed to pattern the upper protective layer 43 and the metal layer 44 to form an upper conductor wiring layer 8 composed of the contact plug 41, the lower protective layer 42, the upper protective layer 43 and the metal layer 44 having a wiring pattern as designed. The upper protective layer 43 is electrically connected to the contact plug 41 and the lower protective layer 42 in the contact hole 6, so that the upper conductor wiring layer 8 is electrically connected to the lower conductor wiring layer 3 through the contact plug 41 to complete a multilayered conductor wiring structure, or a two-layer structure composed of the lower conductor wiring layer 3 and the upper conductor wiring layer 8 in this case.

As described above, in the second embodiment, sputter-etching using a sputtering apparatus is only performed when removing a natural oxide layer formed on the upper surface of the metal layer 12 exposed at the bottom of the contact hole 6, and the fluorine compound layer 22 is removed without using sputter-etching.

In the conventional process in which the fluorine compound layer 22 is removed by sputter-etching for a long time, the interlaminar layer 4 is sputtered out to redeposit a layer of the material thereof ($SiO_2$, in this case) on the upper surface portion of the upper protective layer 11 of the lower conductor wiring layer 3 exposed at the bottom of the contact hole 6.

In contrast, according to the second embodiment of the present invention, removal of the fluorine compound layer 22 does not include a long time sputter-etching, so that the production time is significantly reduced and the redeposition of the material of the interlaminar insulating layer 4 does not occur.

The second embodiment is also advantageous because, although the upper protective layer 13 of the lower conductor wiring layer 3 removed in the portion exposed in the contact hole 6, the lower protective layer 42 of the upper conductor wiring layer 8 is present in the contact hole 6 to ensure the resistance to electromigration of the lower conductor wiring layer 3. It is also advantageous that the contact resistance is further reduced without reduction in the resistance to electromigration, by removing the upper protective layer 13 of the lower conductor wiring layer 3 in the portion corresponding to the contact hole 6 and by forming the contact plug 41 filling the contact hole 6 (i.e., the inner space of the contact hole 6 that is defined by the lower protective layer 42 of the upper conductor wiring layer 8) with an aluminum alloy having a resistivity lower than that of titanium of the upper protective layer 13.

The advantage common to the first and second embodiments will be further described by way of the following experiments.

Experiment 1

The fluorine compound layer 22 was removed in the above-mentioned ashing apparatus, in which the flow of $CHF_3$ gas of a second etchant gas composed of a gas mixture of $CHF_3$ gas and $O_2$ gas was varied and the etching rate was determined for the upper protective layer 13 of Ti of the lower conductor wiring layer 3 (hereinafter referred to as "Ti rate") and for the interlaminar insulating layer 4 Of $SiO_2$ (hereinafter referred to as "$SiO_2$ rate"). This experiment was conducted under the conditions of: an $O_2$ gas flow of the second etchant gas fixed at 400 cc/min, a magnetron current of 400 mA, a pressure of 100 Pa, and a temperature of the silicon semiconductor substrate 1 of 190° C. The experimental results are summarized in FIG. 3 and Table 1 below.

TABLE 1

| $CHF_3$ flow (cc/min) | TI rate (nm/min) | $SiO_2$ rate (nm/min) |
| --- | --- | --- |
| 0 | 0 | 0 |
| 20 | 1050 | 12 |
| 40 | 1200 | 40 |
| 60 | 1200 | 100 |

As can be seen from the results, when the $CHF_3$ gas flow exceeds 40 cc/min and approaches 60 cc/min, the $SiO_2$ rate is not negligible with respect to the Ti rate. The $CHF_3$ gas flow of about 20 cc/min causes no problem, but $CHF_3$ gas flows of far less than 20 cc/min would cause reduction in the Ti rate. Therefore, the second etchant gas preferably contains $CHF_3$ in a mixing ratio of from 1% to 10% based on the total second etchant gas flow. When the $CHF_3$ gas flow is in this range and other parameters have proper values, the $SiO_2$ rate is negligibly small with respect to the Ti rate. This means that the redeposition of $SiO_2$ due to sputtering out of the interlaminar insulating layer 4 is prevented during removal of the fluorine compound layer 22.

Experiment 2

The same ashing apparatus was used to remove the fluorine compound layer 22, in which the relationship between the temperature of the silicon semiconductor substrate 1 (hereinafter referred to as "substrate temperature") and the Ti and $SiO_2$ rates was studied. This experiment was conducted under the conditions of: the second etchant gas flow fixed as $O_2$/CHF=400/20 cc/min, a pressure of 100 Pa, and a magnetron current of 400 mA. The experimental results are summarized in FIG. 4 and Table 2 below.

TABLE 2

| Substrate temperature (°C.) | Ti rate (nm/min) | $SiO_2$ rate (nm/min) |
| --- | --- | --- |
| 100 | 20 | 8 |
| 150 | 190 | 10 |
| 170 | 570 | 12 |
| 190 | 1050 | 30 |
| 220 | 1100 | 100 |

As can be seen from the results, when the substrate temperature is less than 150° C. and close to 100° C., the Ti rate is reduced so that the $SiO_2$ rate is not negligible with respect to the Ti rate. A substrate temperature of 220° C. causes no problem, but as the substrate temperature is further increased, the $SiO_2$ rate becomes greater and not negligible with respect to the Ti rate. Therefore, the substrate temperature is preferably in the range of from 150° C. to 220° C. When the substrate temperature is in this range and other parameters have proper values, the SiO$_2$ rate is negligibly small with respect to the Ti rate. This means that the redeposition of SiO$_2$ due to sputtering out of the interlaminar insulating layer 4 is prevented during removal of the fluorine compound layer 22.

As herein described above, according to the present invention, a fluorine compound layer formed on the bottom of a contact hole during forming the contact layer by etching an interlaminar insulating layer, can be removed without undesirable deposition of splash particles generated from the interlaminar insulating layer, to provide a semiconductor device having a reduced contact resistance and good long term reliability of the interwiring connection in a multilayered conductor wiring structure with a reduced production time.

I claim:

1. A semiconductor device, comprising:
   a semiconductor substrate;
   a first insulating layer formed over the semiconductor substrate;
   a first conductor wiring layer formed on the first insulating layer and having a three-layer structure composed by sequential deposition of a first conductive lower protective layer, a first metal layer, and a first conductive upper protective layer in that order;
   a second insulating layer covering the first conductor wiring layer;
   a contact hole extending through the second insulating layer and the first conductive upper protective layer of the first conductor wiring layer to expose an upper surface portion of the first metal layer; and
   a second conductor wiring layer formed and patterned on the inner surface of the contact hole and on the second insulating layer and having a three-layer structure composed by sequential deposition of a second conductive lower protective layer, a second metal layer, and a second conductive upper protective layer in that order, the second conductor wiring layer being electrically connected to the first conductor wiring layer through the second conductive lower protective layer electrically connected to the entire area of the upper surface portion of the first metal layer defining the bottom surface of the contact hole.

2. A semiconductor device according to claim 1, wherein the first conductive lower protective layer, the first conductive upper protective layer, the second conductive lower protective layer, and the second conductive upper protective layer comprise one material selected from TiN, Ti, and a two-layer material composed of a lower Ti layer and an upper TiN layer and wherein the first metal layer and the second metal layer comprise an aluminum alloy.

3. A semiconductor device, comprising:
   a semiconductor substrate;
   a first insulating layer formed over the semiconductor substrate;
   a first conductor wiring layer formed on the first insulating layer and having a three-layer structure composed by sequential deposition of a first conductive lower protective layer, a first metal layer, and a first conductive upper protective layer in that order;
   a second insulating layer covering the first conductor wiring layer;
   a contact hole extending through the second insulating layer and the first conductive upper protective layer of the first conductor wiring layer to expose an upper surface portion of the first metal layer; and
   a second conductor wiring layer composed of a second conductive lower protective layer covering an inner surface of the contact hole and defining an inner space of the contact hole, a contact plug filling the inner space of the contact hole, a second conductive upper protective layer formed and patterned on the second insulating layer including the portion above the contact hole, and a second metal layer formed and patterned on the second conductive upper protective layer to have substantially the same shape as the second conductive upper protective layer, the second conductor wiring layer being electrically connected to the first conductor wiring layer through the second conductive lower protective layer electrically connected to the entire area of the upper surface portion of the first metal layer defining the bottom surface of the contact hole.

4. A semiconductor device according to claim 3, wherein the first conductive lower protective layer, the first conductive upper protective layer, the second conductive lower protective layer, and the second conductive upper protective layer comprise one material selected from TiN, Ti, and a two-layer material composed of a lower Ti layer and an upper TiN layer and wherein the first metal layer and the second metal layer comprise an aluminum alloy.

5. A process of producing a semiconductor device, comprising:
   a first step of forming a first insulating layer over a semiconductor substrate and then sequentially depositing on the first insulating layer a first conductive lower protective layer, a first metal layer, and a first conductive upper protective layer in that order;
   a second step of patterning the first conductive lower protective layer, the first metal layer, and the first conductive upper protective layer to form a first conductor wiring layer having a three-layer structure;
   a third step of forming a second insulating layer covering the first conductor wiring layer;
   a fourth step of etching the second insulating layer by using an first etchant gas containing a fluorine-based gas and an inert gas to form a contact hole, thereby exposing a surface portion of the first conductive upper protective layer of the first conductor wiring layer;
   a fifth step of, after the fourth step, etching the entire area of the first conductive upper protective layer in a portion exposed in the contact hole by using a second etchant gas containing a fluorine-based gas and oxygen gas to expose an upper surface portion of the first metal layer;
   a sixth step of sequentially forming on an inner surface of the contact hole and on the second insulating layer a second conductive lower protective layer, a second metal layer, and a second conductive upper protective layer in that order to electrically connect the second conductive lower protective layer to the entire area of the upper surface portion of the first metal layer defining a bottom surface of the contact hole;
   a seventh step of patterning the second conductive lower protective layer, the second metal layer, and the second conductive upper protective layer to form a second conductor wiring layer electrically connected to the first conductor wiring layer and having a three-layer structure.

6. A process according to claim 5, further comprising an eighth step of etching the second insulating layer with an agent containing a buffered fluoric acid after the third step.

7. A process according to claim 5, wherein, in the fourth step, the fluorine-based gas contained in the first etchant gas is at least one selected from $CF_4$ and $CHF_3$ and the inert gas contained in the first etchant gas is Ar gas.

8. A process according to claim 5, wherein, in the fifth step, the fluorine-based gas contained in the second etchant gas is at least one selected from the group consisting of $CHF_3$, $CF_4$, $CH_2F_2$, $C_2F_6$, $C_4F_8$, and $SF_6$.

9. A process according to claim 5, wherein, in the fifth step, the fluorine-based gas is present in a mixing ratio of from 1% to 10% based on the total flow of the second etchant gas.

10. A process according to claim 5, wherein, in the fifth step, the semiconductor substrate is held at a temperature of from 150° C. to 220° C.

11. A process according to claim 5, further comprising an eighth step of cleaning the inside of the contact hole with a cleaning liquid after the fifth step and before the sixth step.

12. A process of producing a semiconductor device, comprising:
- a first step of forming a first insulating layer over a semiconductor substrate and then sequentially depositing on the first insulating layer a first conductive lower protective layer, a first metal layer, and a first conductive upper protective layer in that order;
- a second step of patterning the first conductive lower protective layer, the first metal layer, and the first conductive upper protective layer to form a first conductor wiring layer having a three-layer structure;
- a third step of forming a second insulating layer covering the first conductor wiring layer;
- a fourth step of etching the second insulating layer by using an first etchant gas containing a fluorine-based gas and an inert gas to form a contact hole, thereby exposing a surface portion of the first conductive upper protective layer of the first conductor wiring layer;
- a fifth step of, after the fourth step, etching the entire area of the first conductive upper protective layer in a portion exposed in the contact hole by using a second etchant gas containing a fluorine-based gas and oxygen gas to expose an upper surface portion of the first metal layer;
- a sixth step of forming a second conductive lower protective layer covering an inner surface of the contact hole to electrically connect the second conductive lower protective layer to the entire area of the upper surface portion of the first metal layer defining a bottom surface of the contact hole;
- a seventh step of forming a conductive contact plug filling an inner space of the contact hole defined by the second conductive lower protective layer;
- an eighth step of sequentially forming a second conductive upper protective layer and a second metal layer on the second insulating layer including a portion above the contact hole in that order to electrically connect the second conductive upper protective layer to the second conductive lower protective layer and the contact plug, which are within the contact hole;
- a ninth step of patterning the second conductive upper protective layer and the second metal layer to form a second conductor wiring layer electrically connected to the first conductor wiring layer and composed of the second conductive lower layer, the contact plug, the second conductive upper protective layer and the second metal layer.

13. A process according to claim 12, wherein, in the fourth step, the fluorine-based gas contained in the first etchant gas is at least one selected from $CF_4$ and $CHF_3$ and the inert gas contained in the first etchant gas is Ar gas.

14. A process according to claim 12, wherein, in the fifth step, the fluorine-based gas contained in the second etchant gas is at least one selected from the group consisting of $CHF_3$, $CF_4$, $CH_2F_2$, $C_2F_6$, $C_4F_8$, and $SF_6$.

15. A process according to claim 12, wherein, in the fifth step, the fluorine-based gas is present in a mixing ratio of from 1% to 10% based on the total flow of the second etchant gas.

16. A process according to claim 12, wherein, in the fifth step, the semiconductor substrate is held at a temperature of from 150° C. to 220° C.

17. A process according to claim 12, further comprising a tenth step of cleaning the inside of the contact hole with a cleaning liquid after the fifth step and before the sixth step.

* * * * *